(12) United States Patent
Yano et al.

(10) Patent No.: US 6,526,539 B1
(45) Date of Patent: Feb. 25, 2003

(54) TURBO DECODER

(75) Inventors: Tetsuya Yano, Kawasaki (JP);
Kazuhisa Obuchi, Kawasaki (JP);
Kazuo Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/574,042

(22) Filed: May 18, 2000

(30) Foreign Application Priority Data

Jun. 23, 1999 (JP) .......................................... 11-176617

(51) Int. Cl.[7] .............................................. H03M 13/03
(52) U.S. Cl. ...................................... 714/794; 714/786
(58) Field of Search ................................ 375/341, 130; 714/796, 794, 786, 787, 788, 792, 793

(56) References Cited

U.S. PATENT DOCUMENTS 6,145,114 A * 11/2000 Crozier et al. .............. 714/794
6,304,996 B1 * 10/2001 Van Stralen et al. ......... 714/796
6,377,607 B1 * 4/2002 Ling et al. ................... 375/130
6,393,076 B1 * 5/2002 Dinc et al. ................... 375/341

FOREIGN PATENT DOCUMENTS

JP          05075480          3/1993

* cited by examiner

*Primary Examiner*—David Ton
(74) *Attorney, Agent, or Firm*—Katten, Muchin, Zavis, Rosenman

(57) ABSTRACT

A turbo decoder is provided in which a distribution of likelihood values that are obtained during the course of turbo-decoding is watched and scaling of an operation object to be subjected to subsequent likelihood computation of the turbo-decoding is performed in accordance with the distribution. This turbo decoder can reduce the cost, size, and power consumption of a transmission system and equipment, increase their reliability, and improve the transmission quality and performance.

54 Claims, 12 Drawing Sheets

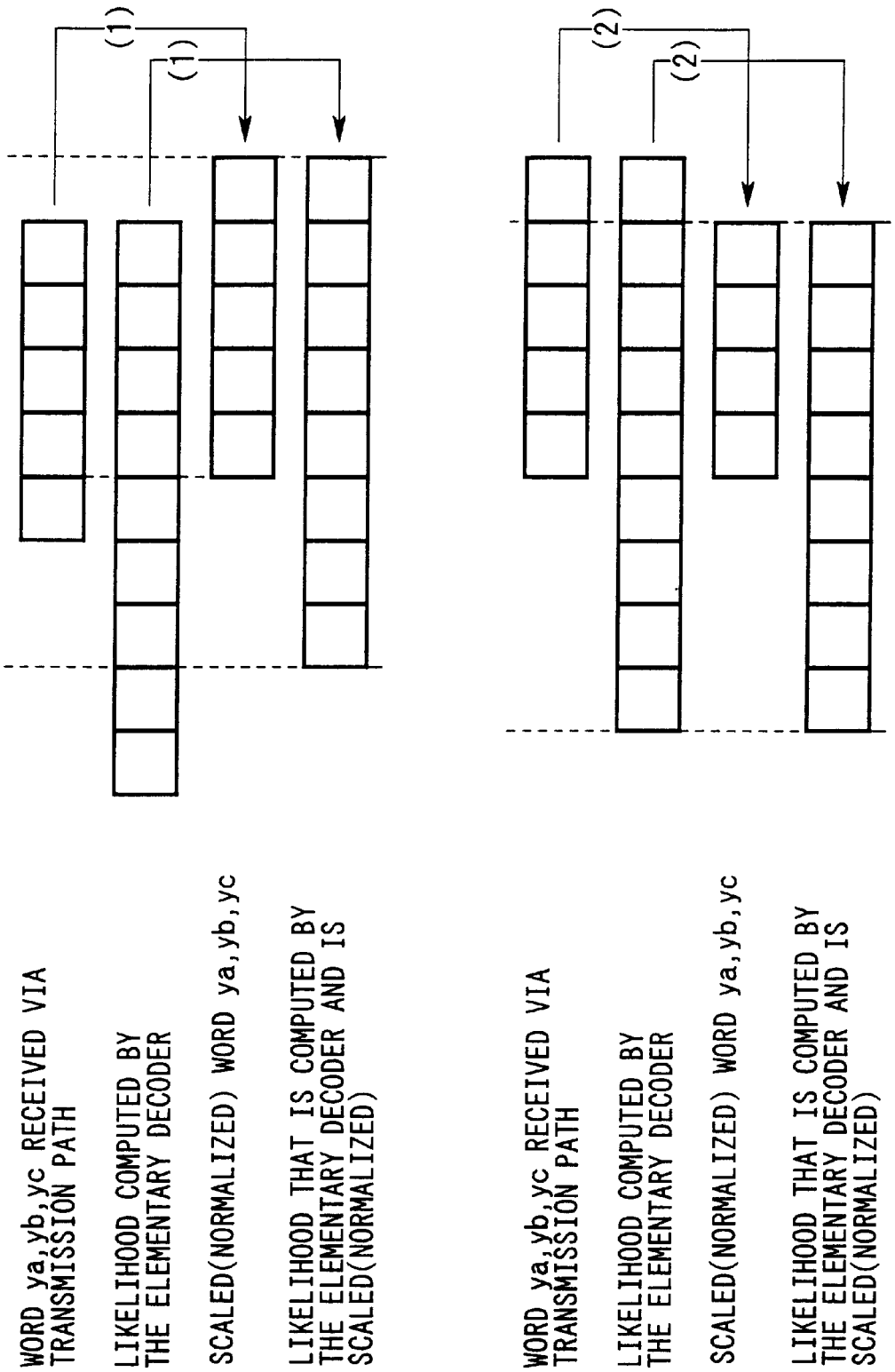

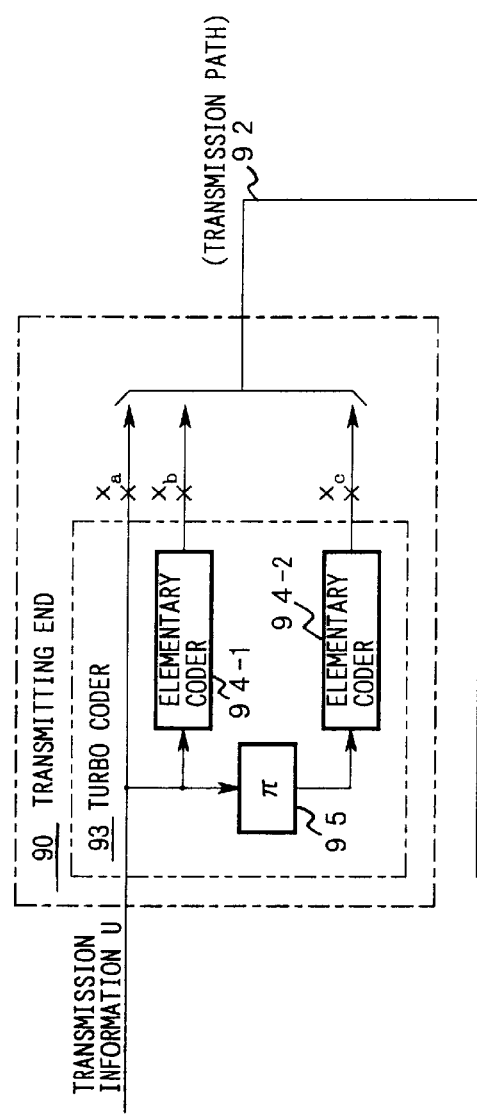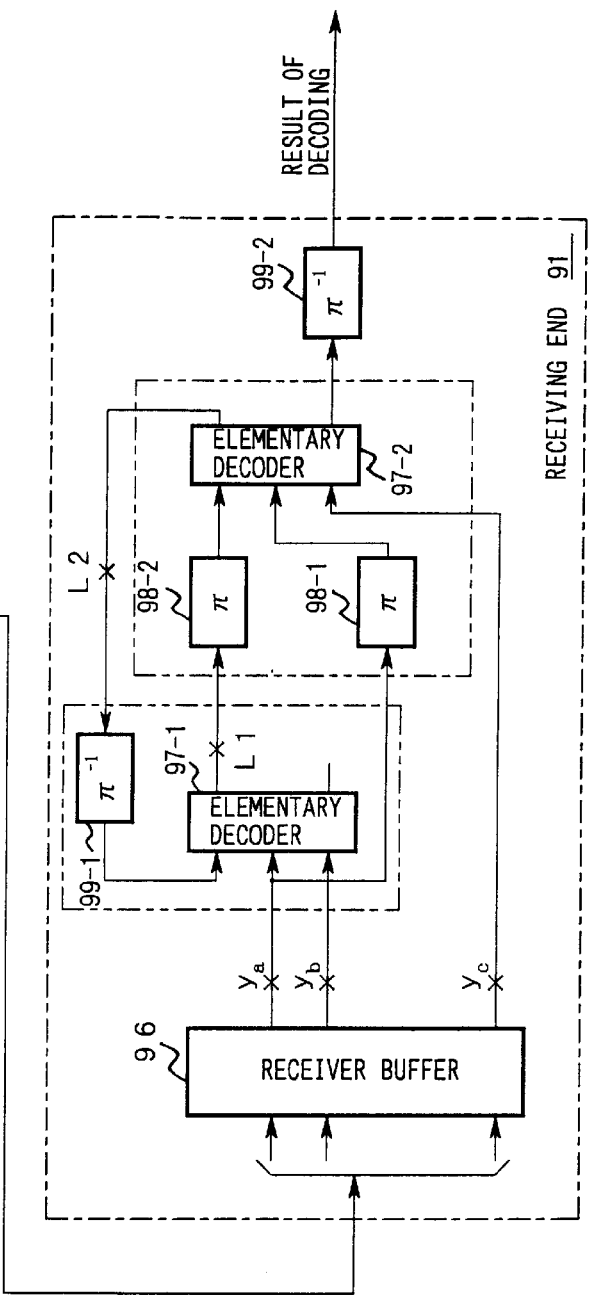
PRIOR ART FIG. 9

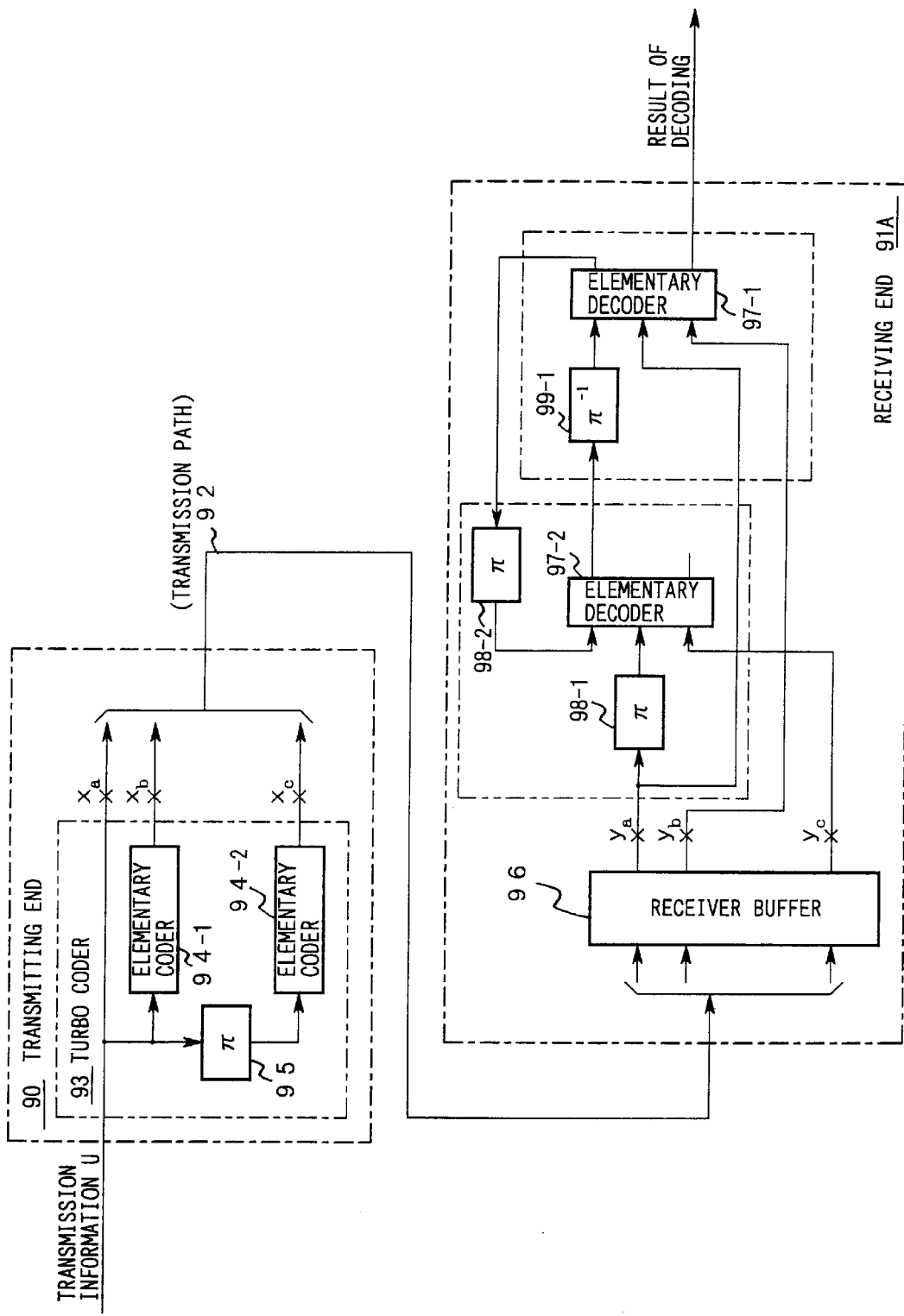

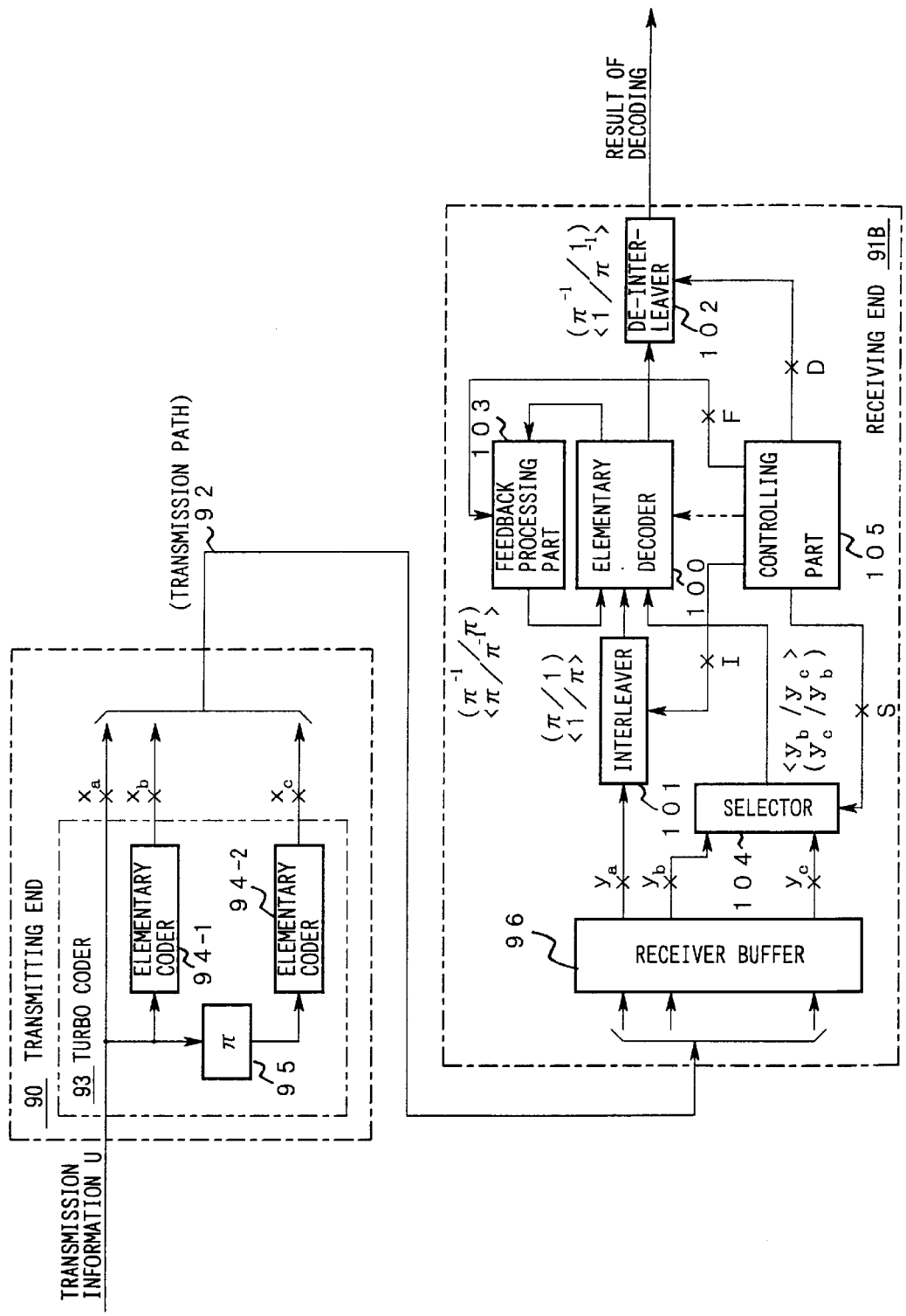
PRIOR ART FIG. 11

TURBO DECODER

BACKGROUND OF THE INVENTION

1. Field of the Invention

The present invention relates to a turbo decoder for decoding a sequence that has been generated according to a turbo-coding scheme.

2. Description of the Related Art

A transmission system using a turbo-decoding scheme can provide, for a desired transmission rate (SN ratio), an SN ratio (transmission rate) that is very close to the maximum SN ratio (transmission rate; generally called the Shannon limit) that is given by Shannon's channel coding theorem, because decoding that conforms to an error correcting coding scheme that was used in the transmitting end is repeatedly performed in the receiving end.

Therefore, the turbo coder and the turbo decoder are promising as devices that can be applied to not only deep space communication but also mobile communication, broadcast, and reproduction systems of magnetic recording media, and applications in these fields are now being studied, developed, and put into practical use enthusiastically.

FIG. 9 is a block diagram showing the configuration of a first example transmission system using a turbo-decoding scheme.

As shown in FIG. 9, a transmitting end 90 and a receiving end 91 are connected to each other via a transmission path 92.

In the transmitting end 90, transmission information U is supplied to a turbo coder 93 and the outputs of the turbo coder 93 are connected to one ends of the transmission path 92.

In the turbo coder 93, the transmission information U is supplied to the inputs of an elementary encoder 94-1 and an interleaver (π) 95 and the output of the interleaver 95 is connected to the input of an elementary encoder 94-2. A transmission sequence consisting of the following items is obtained at the output of the turbo coder 93:

Code words (non-coded words) Xa that have been generated without coding processing applied to the transmission information U.

Code words Xb that have been generated with prescribed error correcting coding processing applied to the transmission information U in the elementary encoder 94-1.

Code words Xc that have been generated with prescribed error correcting coding processing applied to the transmission information U in the elementary encoder 94-2.

In the receiving end 91, a received sequence consisting of words ya, yb, and yc that have been transmitted over the transmission path 92, correspond to the respective code words Xa, Xb, and Xc, and are obtained as results of soft decision is supplied to corresponding inputs of a receive buffer 96.

In general, the received sequence is deteriorated in SN ratio because of a fluctuation of the transmission characteristics of the transmission path 92 and noise that has been superimposed in the transmission path 92.

Among the outputs of the receive buffer 96, the output corresponding to the words ya is connected to the first input of an elementary decoder 97-1 and the input of an interleaver (π) 98-1. The output of the interleaver 98-1 is connected to the first input of an elementary decoder 97-2. Among the outputs of the receive buffer 96, the outputs corresponding to the words yb and yc are connected to the second inputs of the respective elementary decoders 97-1 and 97-2. The output of the elementary decoder 97-1 is connected to the third input of the elementary decoder 97-2 via an interleaver 98-2. One output of the elementary decoder 97-2 is connected to the third input of the elementary decoder 97-1 via a de-interleaver (π–1) 99-1, and the other output of the elementary decoder 97-2 is connected to the input of a de-interleaver (π–1) 99-2. A decoding result is obtained at the output of the de-interleaver 99-2.

For the sake of simplicity, it is assumed that the coding that is performed by each of the elementary coders 94-1 and 94-2 is convolutional coding using a common constraint length and rate of coding.

In the above-configured receiving end 91, a received sequence that has been transmitted over the transmission path 92 is separated into words ya, yb, and yc on a prescribed code block basis and stored in storage areas of the receive buffer 96 corresponding to the respective kinds of words ya, yb, and yc.

The elementary decoders 97-1 and 97-2, the interleavers 98-1 and 98-2, and the de-interleavers 99-1 and 99-2 are initialized prior to a start of decoding processing to be performed on those code blocks.

After completion of the initialization, the elementary decoder 97-1 outputs a likelihood L1 by performing decoding processing that conforms to the coding processing that was performed by the elementary coder 94-1 in the transmitting end 90 on a likelihood that is supplied from the elementary decoder 97-2 via the de-interleaver 99-1 and words ya and yb that are supplied from the receive buffer 96 on a bit-by-bit basis.

The interleavers 98-1 and 98-2 perform the same interleave processing as performed by the interleaver 95 in the transmitting end 90 on the word ya that is supplied parallel from the receive buffer 96 and the likelihood L1, respectively.

The elementary decoder 97-2 outputs a likelihood L2 and a demodulation result (for simplicity, it is assumed here that the demodulation result is obtained as a result of hard decision) by performing decoding processing that conforms to the coding processing that was performed by the elementary coder 94-2 in the transmitting end 90 on results of the above interleave processing and a word yc that is supplied from the receive buffer 96 on a bit-by-bit. basis.

The de-interleaver 99-2 outputs a most probable decoding result for the transmission information U by de-interleaving the demodulation result in the same manner as the de-interleaver 99-1 does.

In the receiving end 91, the elementary decoders 97-1 and 97-2, the interleavers 98-1 and 98-2, and the de-interleavers 99-1 and 99-2 cooperate to repeatedly perform, together with the receive buffer 96, the above processing on a bit-by-bit basis a prescribed number of times.

Since at the output of the de-interleaver 99-2 the above-mentioned likelihood is increased gradually during the course of the decoding that is repeated in the above-described manner, transmission information could be obtained that has been restored with higher precision than in a transmission system using a concatenated code.

FIG. 10 is a block diagram showing the configuration of a second transmission system using a turbo-decoding scheme.

The components in FIG. 10 having the same function and configuration as the corresponding components in FIG. 9 are given the same reference symbols as the latter and will not be described below.

The transmission system of FIG. 10 is different in configuration from that of FIG. 9 in a receiving end 91A that replaces the receiving end 91.

In the receiving end 91A, as indicated by two-dot-chain-line frames in FIGS. 9 and 10, decoding processing corresponding to the coding processing performed by the elementary coder 94-1 in the transmitting end 90 and decoding processing corresponding to the coding processing performed under cooperation between the interleaver 95 and the elementary coder 94-2 are performed in order that is reverse to the order in the receiving end 91 shown in FIG. 9.

Therefore, a most probable decoding result for transmission information U is obtained at the output of the elementary decoder 97-1 without intervention of the de-interleaver 99-2.

FIG. 11 is a block diagram showing the configuration of a third transmission system using a turbo-decoding scheme.

The components in FIG. 11 having the same function and configuration as the corresponding components in FIG. 9 are given the same reference symbols as the latter and will not be described below.

The transmission system of FIG. 11 is different in configuration from that of FIG. 9 in a receiving end 91B that replaces the receiving end 91.

The receiving end 91B is different in configuration from the receiving end 91 in that an elementary decoder 100 serving as both of the elementary decoders 97-1 and 97-2 is provided in place of the elementary decoders 97-1 and 97-2; that an interleaver 101 is provided in place of the interleaver 98-1; that a de-interleaver 102 is provided in place of the de-interleaver 99-2; that a feedback processing part 103 serving as both of the interleaver 98-2 and the de-interleaver 99-1 is provided in place of the interleaver 98-2 and the de-interleaver 99-1; that a selector 104 is provided between the outputs corresponding to words yb and yc among the outputs of the receive buffer 96 and one input of the elementary decoder 100; and that a controlling part 105 is provided to which output ports corresponding to control terminals of the elementary decoder 100, the interleaver 101, the de-interleaver 102, the feedback processing part 103, the selector 104, and the receive buffer 96 are connected.

In the receiving end 91B having the above configuration, the controlling part 105 synchronizes with words ya, yb, and yc that are read out from the receive buffer 96 on a bit-by-bit basis and alternately makes switching for the following forms and pieces of information on a bit-by-bit basis:

(a) Forms of decoding processing to be performed by the elementary decoder 100.

(b) Information I indicating whether the interleaver 101 should perform interleave processing.

(c) Information D indicating whether the de-interleaver 102 should perform de-interleave processing.

(d) Information F indicating one of interleave processing and de-interleaving processing to be performed by the feedback processing-part 103.

(e) Information S indicating one of words yb and yc to be selected by the selector 104.

That is, the elementary decoder 100 performs decoding processing that is equivalent to the decoding processing that is performed by the elementary decoders 97-1 and 97-2 shown in FIG. 9 or 10 by cooperating with the-interleaver 101, the de-interleaver 102, the feedback processing part 103, the selector 104, and the receive buffer 96 under the control of the controlling part 105.

Therefore, the performance of the receiving end 91B does not lower as long as the above-described cooperation is made properly and the decoding processing that is performed under such cooperation is performed at a prescribed speed, and its hardware scale is made smaller than of the receiving ends 91 or 91A shown in FIG. 9 or 10.

In FIG. 11, each of the pieces of information I, D, and F for which switching is made alternately as mentioned above is given as a permutation of words that are two of the following items that are separated by a separator u/h and selected in time-series order cyclically:

"$\pi$" indicating a state that interleave processing should be performed.

"$\pi^{-1}$" indicating a state that de-interleave processing should be performed.

"1" indicating a state that neither interleave processing nor de-interleave processing is necessary and input information should be output without being subjected to none of those.

In FIG. 11, similarly, the information S is a permutation of symbols "yb" and "yc" showing respective words yb and yc to be selected by the selector 104 that are separated by a separator "/" and selected in time-series order cyclically.

Further, in FIG. 11, two kinds of information enclosed in less than and greater than signs <> or parentheses ( ) are shown for each of the pieces of information I, D, F, and S. Of the two kinds of information, the information enclosed in less than and greater than signs <> indicates a combination to be used to realize processing that is equivalent to the decoding processing that is performed in the receiving end 91 shown in FIG. 9. The information enclosed in parentheses ( ) indicates a combination to be used to realize processing that is equivalent to the decoding processing that is performed in the receiving end 91A shown in FIG. 10.

Incidentally, in the above conventional examples, as shown in FIG. 12, the likelihood value L1 or L2 that is computed by the elementary decoders 97-1, 97-2, or 100 increases as the number N of times of repetitive execution of the above-described decoding processing by the elementary decoder 97-1, 97-2 or 100 increases.

For example, to maintain high transmission quality even in a case where the number N is large because the transmission characteristics of the transmission path 92 frequently vary to a large extent or the level of noise superimposed on a transmission sequence in the transmission path 92 is high, the elementary decoders 97-1, 97-2, 100 need to perform operations with a word length that is much longer than the word length of words ya, yb, and yc that are obtained as a received sequence.

Further, the word length per unit storage area of a memory to be used for the interleave processing or the de-interleave processing by the interleavers 98-1 and 98-2 and the de-interleavers 99-1 and 99-2 also becomes very long.

Therefore, in the conventional examples, the scale of hardware constituting the receiving end becomes larger when larger deterioration in transmission quality may occur in the transmission path 92.

In general, an attempt to suppress increase in hardware scale tends to encounter limitations relating to the following items. This may prevent application of the turbo coding scheme or attainment of desired transmission quality.

Circuit type

Selection of devices to be used

Power consumption

Mounting technology including thermal designing

Algorithms of decoding processing to be performed by the elementary decoders 97-1, 97-2, and 100.

SUMMARY OF THE INVENTION

An object of the present invention is to provide a turbo decoder which can flexibly adapt to a variety of transmission characteristics of transmission paths and can secure high transmission quality without the need for greatly changing the hardware scale and configuration.

Another object of the invention is to provide a turbo decoder which can prevent a large drop in the accuracy of obtaining likelihood and approximately keep the range of likelihood values fixed even in a case where likelihood is obtained repeatedly over a large number of times or over a number of times that may vary to a large extent during the course of turbo-decoding.

Another object of the invention is to provide a turbo decoder which can make the gain of turbo-decoding larger than in a case where interleave processing is performed with a constant word length and precision irrespective of the form of scaling that is determined by a scaling section (described later).

Still another object of the invention is to provide a turbo decoder which can reduce the scale of hardware and enables efficient turbo-decoding even in a case where coding is repeated over a number N of times during the course of turbo-coding, where N is large or may be changed.

Yet another object of the invention is to provide a turbo decoder which can reduce the scale of hardware and enables efficient turbo-decoding not only in a case where coding is repeated over a large number of times or over a variable number of times during the course of turbo-coding, but even in a case where the coding scheme is unfixed or may vary.

A further object of the invention is to provide a turbo decoder which can simplify the configuration of hardware as long as the word length of the likelihood determined by the decoding section is within an allowable range.

Another object of the invention is to provide a turbo decoder which can determine likelihood with high accuracy during the course of turbo-decoding while preventing the order from increasing rapidly.

Another object of the invention is to provide a turbo decoder which can perform scaling efficiently with high reliability, according to simple arithmetic operations.

Still another object is to provide a turbo decoder which can simplify the configuration of a decoding section that is incorporated in a transmission system or equipment.

Yet another object of the invention is to provide a turbo decoder which can reduce the cost, size, and power consumption of a transmission system and equipment, increase their reliability, realize highly accurate, highly efficient decoding, and improve the transmission quality and performance.

The above objects are attained by a turbo decoder in which a distribution of likelihood values that are obtained during the course of turbo-decoding is watched and the object of an operation to be subjected to the computation of likelihood subsequent to the turbo-decoding is scaled in accordance with the distribution.

In this turbo decoder, even in a case where likelihood is obtained repeatedly over a large number of times or over a number of times that may vary to a large extent during the course of turbo-decoding, the range of likelihood values is kept approximately fixed without a large drop in the accuracy in obtaining likelihood.

The above objects are attained by a turbo decoder in which interleave processing to be performed during the subsequent operation is performed in block on a word, among the objects of the turbo-decoding, representing transmission information that was appended on a common code block without being subjected to any coding on a transmitting end.

In this turbo. decoder, prescribed interleave processing with a word length and accuracy that conform to scaling determined by a scaling section (described later) is properly performed on a non-coded word to be subjected to the subsequent operation.

Therefore, the gain of the turbo-decoding can be enlarged compared to a case where such interleave processing is performed with constant word length and accuracy irrespective of such scaling.

The above objects are attained by a turbo decoder in which interleave processing is newly performed in block after de-interleave processing that nullifies all interleave processing that was performed while a pre-operation was performed.

In this turbo decoder, as long as the responsiveness needed for the de-interleave processing to respond is permitted to drop or the de-interleave processing and the interleave processing are performed in block, the gain of the turbo-decoding can be enlarged compared to a case where the interleave processing is performed with a constant word length and precision irrespective of the form of the scaling that is determined by the scaling section.

The above objects are attained by a turbo decoder in which elementary decoders are provided in a number that is smaller than the number of times coding was performed during the course of turbo-coding on a transmitting end and in which it performs desired decoding processing by these elementary decoders according to pipeline control.

In this turbo decoder, the scale of hardware can be reduced and efficient turbo-decoding is enabled even in a case where coding is repeated over a number N of times during the course of turbo-coding, where N is large or may vary.

The above objects are attained by a turbo decoder in which the number of the elementary decoders provided is "1" and plural kinds of turbo-decoding, including the desired decoding processing are performed in series by the elementary decoder.

In this turbo decoder, the scale of hardware can be reduced and efficient turbo-decoding is enabled not only in a case where coding is repeated over a large number of times or over a variable number of times during the course of turbo-coding, but even in a case where the coding scheme is unfixed or may be changed.

The above objects are attained by a turbo decoder in which interleave processing and de-interleave processing to be performed repeatedly during the course of the turbo-decoding are performed while reading from a memory for storing an operation object of the interleave processing and the de-interleave processing.

In this turbo decoder, since the above-mentioned scaling is performed en bloc during the course of interleave processing and de-interleave processing, the configuration of hardware can be simplified as long as the word length of the likelihood determined during the course of the decoding is within an allowable range.

The above objects are attained by a turbo decoder in which when an order increase between a previously obtained likelihood and a subsequently obtained likelihood has exceeded a prescribed value, the likelihood is rounded and used in a further subsequent operation.

In this turbo decoder, when a likelihood value that is obtained as a result of the pre-operation has increased rapidly, a low-order value of the likelihood is rounded and is used as an object of a subsequent operation.

The above objects are attained by a turbo decoder in which the likelihood range (likelihood value distribution) is recognized as a maximum value or an average value of likelihood values obtained previously.

In this turbo decoder, as long as the curve for the distribution of many likelihood values is unimodal in a range that shifts according to the repeated number of times likelihood is obtained and a direction in which that range shifts is known, such a maximum value or an average value represents general features of the range with high accuracy.

Therefore, scaling can be performed efficiently with high reliability according to simple arithmetic operations.

Other objects and features of the invention will become apparent from the following description that will be made with reference to the accompanying.drawings.

BRIEF DESCRIPTION OF THE DRAWINGS

The nature, the principle, and utility of the invention will become more apparent from the following detailed description when read in conjunction with the accompanying drawings in which like parts are designated by identical reference numbers, in which:

FIG. 8 is a chart showing the operation of the fourth embodiment of the invention;

FIG. 9 is a block diagram showing the configuration of a first transmission system using a turbo-decoding scheme;

FIG. 10 is a block diagram showing the configuration of a second transmission system using a turbo-decoding scheme;

FIG. 11 is a block diagram showing the configuration of a third transmission system using a turbo-decoding scheme.

DETAILED DESCRIPTION OF THE PREFERRED EMBODIMENTS

First, the principles of turbo decoders according to the present invention will be described with reference to FIG. 1.

Figure 1:
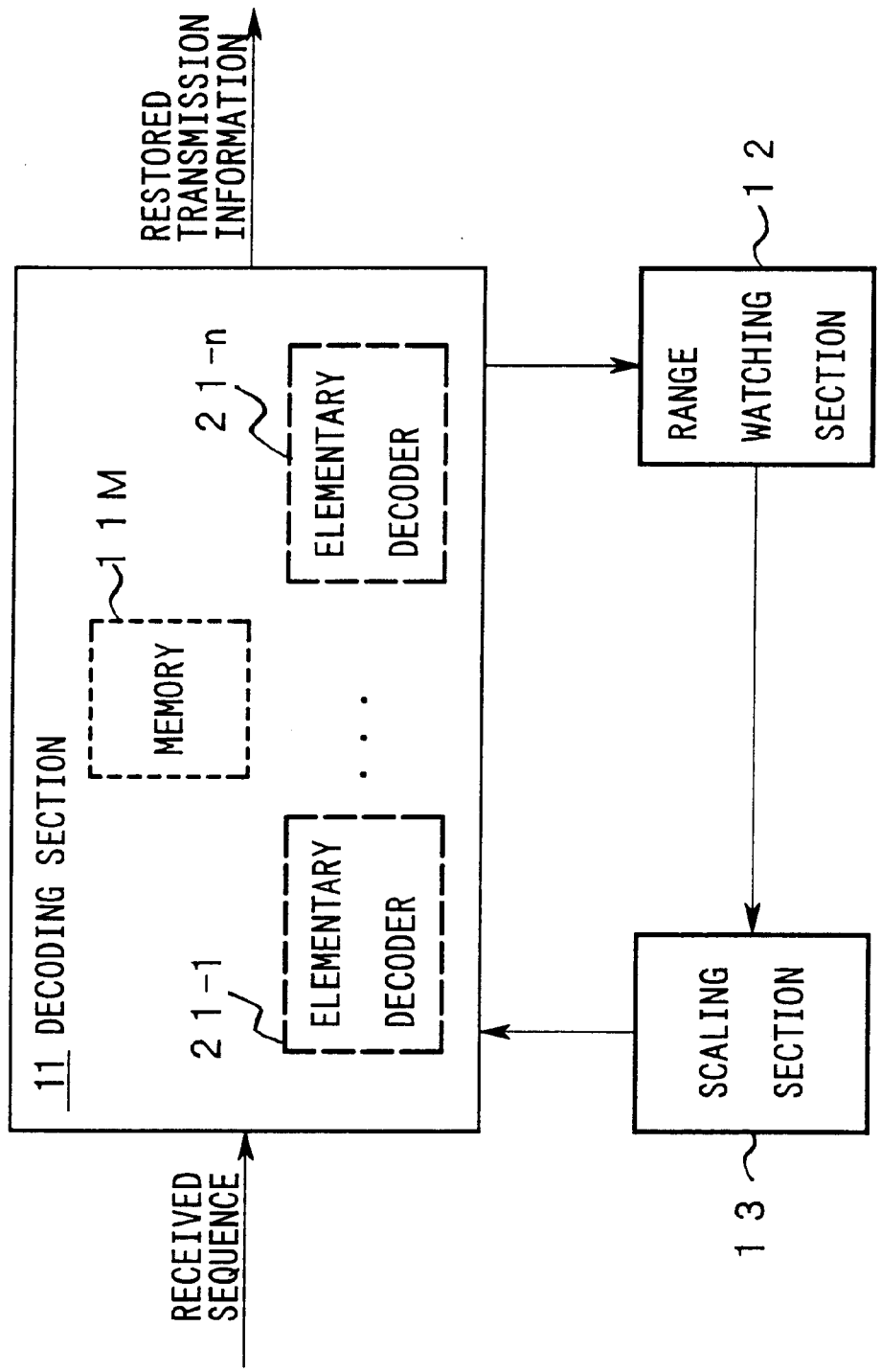
FIG. 1 is a block diagram showing the principles of first to fourth turbo decoders according to the present invention.

FIG. 1 is a block diagram showing the principles of first to fourth turbo decoders according to the invention.

The principle of the first turbo decoder according to the invention is as follows.

A decoding section 11 accepts a received sequence on a code block basis and turbo-decoding on the received sequence by restoring transmission information represented by the received sequence. A range watching section 12 obtains a distribution of likelihood values that are obtained during the course of the turbo-decoding performed by the decoding section 11. A scaling section 13 determines a scaling that will suppress a variation of a distribution of likelihood values obtained as a result of a subsequent operation, to be a scaling for an object of the subsequent operation performed under the distribution obtained by the range watching section 12, where the subsequent operation is performed for the decoding section 11 to complete the turbo-decoding for a common code block. The decoding section 11 applies the scaling determined by the scaling section 13 to the object of the subsequent operation.

In this turbo decoder, even in a case where likelihood is obtained repeatedly over a large number of times or over a number of times that may vary to a large extent during the course of the turbo-decoding, the range of likelihood values is kept approximately fixed without a large drop in the accuracy of obtaining likelihood.

The principle of the second turbo decoder according to the invention is as follows.

The decoding section 11 performs, in block, interleave processing to be performed prior to both a pre-operation that was performed prior to the subsequent operation on a non-coded word, among the objects of the subsequent operation, representing transmission information that was appended to the common code block on a transmitting end without being subjected to any coding, and the subsequent operation, and applies the scaling determined by the scaling section 13 to the non-coded word.

In this turbo decoder, prescribed interleave processing with a word length and accuracy that conform to the scaling determined by the scaling section 13 is properly performed on a non-coded word to be subjected to the subsequent operation. Therefore, the gain of the turbo-decoding can be enlarged compared to a case where such interleave processing is performed with a constant word length and accuracy irrespective of the form of the scaling that is determined by the scaling section 13.

The principle of the third turbo decoder according to the invention is as follows.

The decoding section 11 performs, in block, de-interleave processing that is reversible to all interleave processing that was performed during a pre-operation that was performed prior to the subsequent operation and all interleave processing to be performed prior to the pre-operation and the subsequent operation on a non-coded word, among the objects of the subsequent operation, subjected to the pre-operation and represents transmission information appended to the common code block without being subjected to any coding on a transmitting end, and applies the scaling determined by the scaling section 13 to the non-coded word.

In this turbo decoder, de-interleave processing that nullifies all interleave processing that was performed during a pre-operation is performed on a non-coded word to be subjected to the subsequent operation before execution of prescribed interleave processing with a word length and accuracy that conform to the scaling determined by the scaling section 13.

Therefore, as long as the speed for the de-interleave processing to respond is permitted to drop or the de-interleave processing and the interleave processing are performed in block, the gain of the turbo-decoding can be enlarged compared to a case where the interleave processing is performed with a constant word length and accuracy irrespective of the form of the scaling that is determined by the scaling section 13.

The principle of the fourth turbo decoder according to the invention is as follows.

The decoding section 11 has number n of elementary decoders 21-1 to 21-n and turbo-decodes the received sequence according to a pipeline control while cooperating with the n of elementary decoders 21-1 to 21-n, n being smaller than the number N of times coding was performed during the course of turbo-coding on a transmitting end to generate a transmission sequence corresponding to the received sequence.

In this turbo decoder, the scale of hardware can be reduced and efficient turbo-decoding is enabled even in a case where coding is repeated over a number N of times during the course of turbo-coding, where N is large or may vary.

Figure 2:
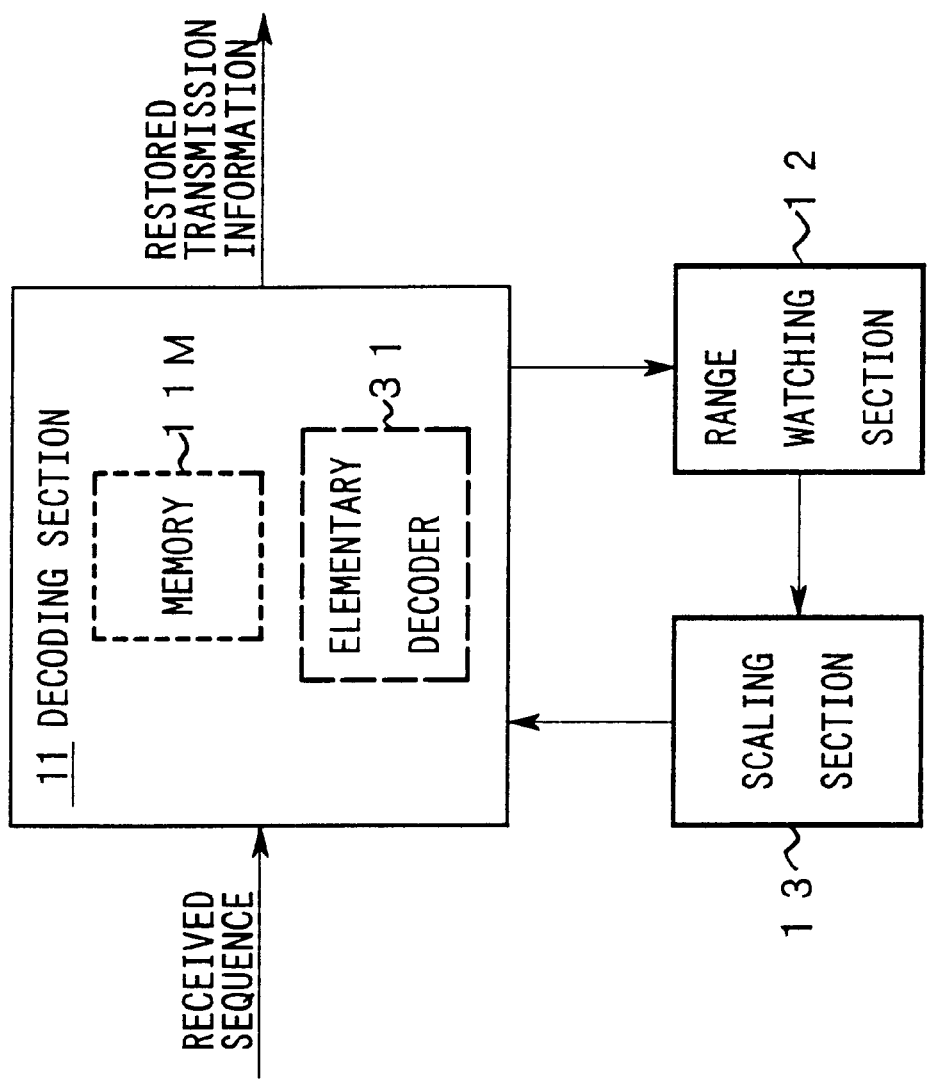
FIG. 2 is a block diagram showing the principles of fifth to eighth turbo decoders according to the,invention.

FIG. 2 is a block diagram showing the principles of fifth to eighth turbo decoders according to the invention.

The principle of the fifth turbo decoder according to the invention is as follows.

The decoding section 11 has a single elementary decoder 31 that can adapt to all of a plurality of decoding schemes that were employed during the course of turbo-coding on a transmitting end to generate a transmission sequence corresponding to the received sequence and performs decoding according to a single designated decoding scheme among the plurality of decoding schemes, and turbo-decodes the received sequence by decoding in series according to the plurality of decoding schemes by using the single elementary decoder 31.

In this turbo decoder, the scale of hardware can be reduced and efficient turbo-decoding is enabled not only in a case where coding is repeated over a large number of times or over a variable number of times during the course of turbo-coding, but even in a case where the coding scheme is unfixed or may vary.

The principle of the sixth turbo decoder according to the invention is as follows.

The decoding section 11 has a memory 11M to be used in interleave processing and de-interleave processing that are performed on the object of the subsequent operation prior to the subsequent operation, and performs the scaling determined by the scaling section 13 while reading from the memory 11M.

In this turbo decoder, since the scaling determined by the scaling section 13 is performed in block during the course of interleave processing and de-interleave processing, the configuration of hardware can be simplified as long as the word length of a likelihood determined by the decoding section 11 and can be stored in the memory 11M is within an allowable range.

The principle of the seventh turbo decoder according to the invention is as follows.

The scaling section 13 obtains, when the scaling should be updated, a range of varied likelihood values as compared with previously determined scaling, and employs, as new scaling, scaling that makes a width of the range smaller than a prescribed threshold value when the width of the range has exceeded the prescribed threshold value.

In this turbo decoder, when a likelihood value that is obtained as a result of the pre-operation has increased rapidly, a low-order value of the likelihood is rounded and is used as an object of a subsequent operation.

The principle of the eighth turbo decoder according to the invention is as follows.

The range watching section 12 obtains the likelihood value distribution as a maximum value or an average value of likelihood values obtained previously.

In this turbo decoder, as long as the curve for the distribution of many likelihood values is unimodal in a range that shifts according to the repeated number of times likelihood is obtained and a direction in which that range shifts is known, such a maximum value or an average value represents general features of the range with high accuracy.

Therefore, scaling-can be performed efficiently with high precision based on simple arithmetic operations.

Embodiments of the invention will be hereinafter described with reference to the drawings.

Figure 3:
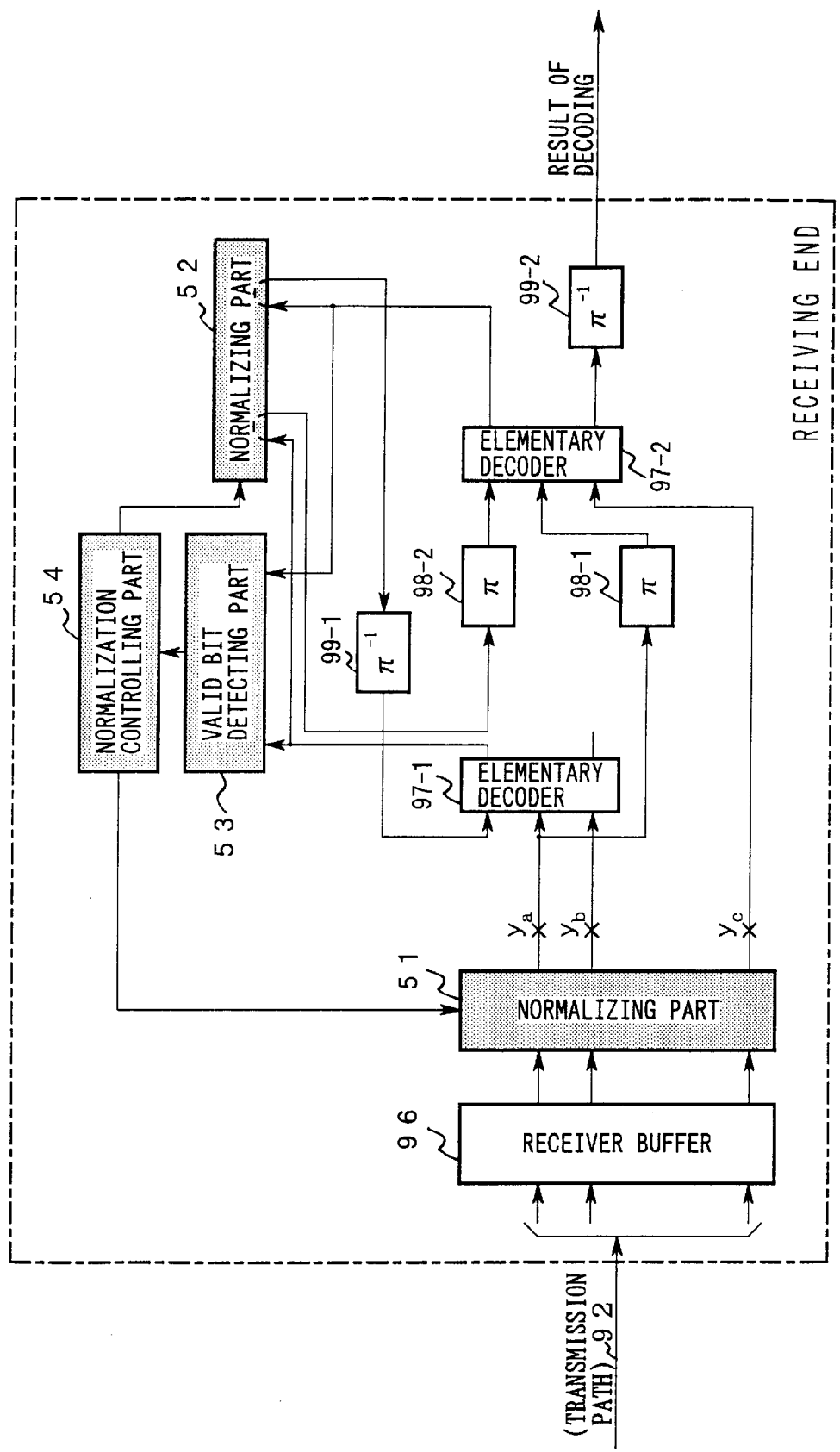
FIG. 3 is a block diagram showing a first embodiment of the invention.

FIG. 3 is a block diagram showing a first embodiment of the invention.

The components in FIG. 3 having the same function and configuration as the corresponding components in FIG. 9 are given the same reference symbols and will not be described below.

This embodiment is different in configuration from the conventional example of FIG. 9 in that a normalizing part 51 is provided between the receive buffer 96 and the elementary decoders 97-1 and 97-2 and the interleaver 98-1; that a normalizing part 52 is provided having a ports that are interposed between the output of the elementary decoder 97-1 and the input of the interleaver 98-2 and ports that are interposed between the output of the elementary decoder 97-2 and the input of the de-interleaver 99-1; that a valid bit detecting part 53 is provided that is directly connected to the outputs of the elementary decoders 97-1 and 97-2; and that a normalization controlling part 54 is provided whose input is directly connected to the output of the valid bit detecting part 53 and that has outputs connected to the control inputs of the respective normalizing parts 51 and 52.

Since the configuration of the transmitting end is the same as in the conventional example of FIG. 9, it is not illustrated nor described.

Figure 4:
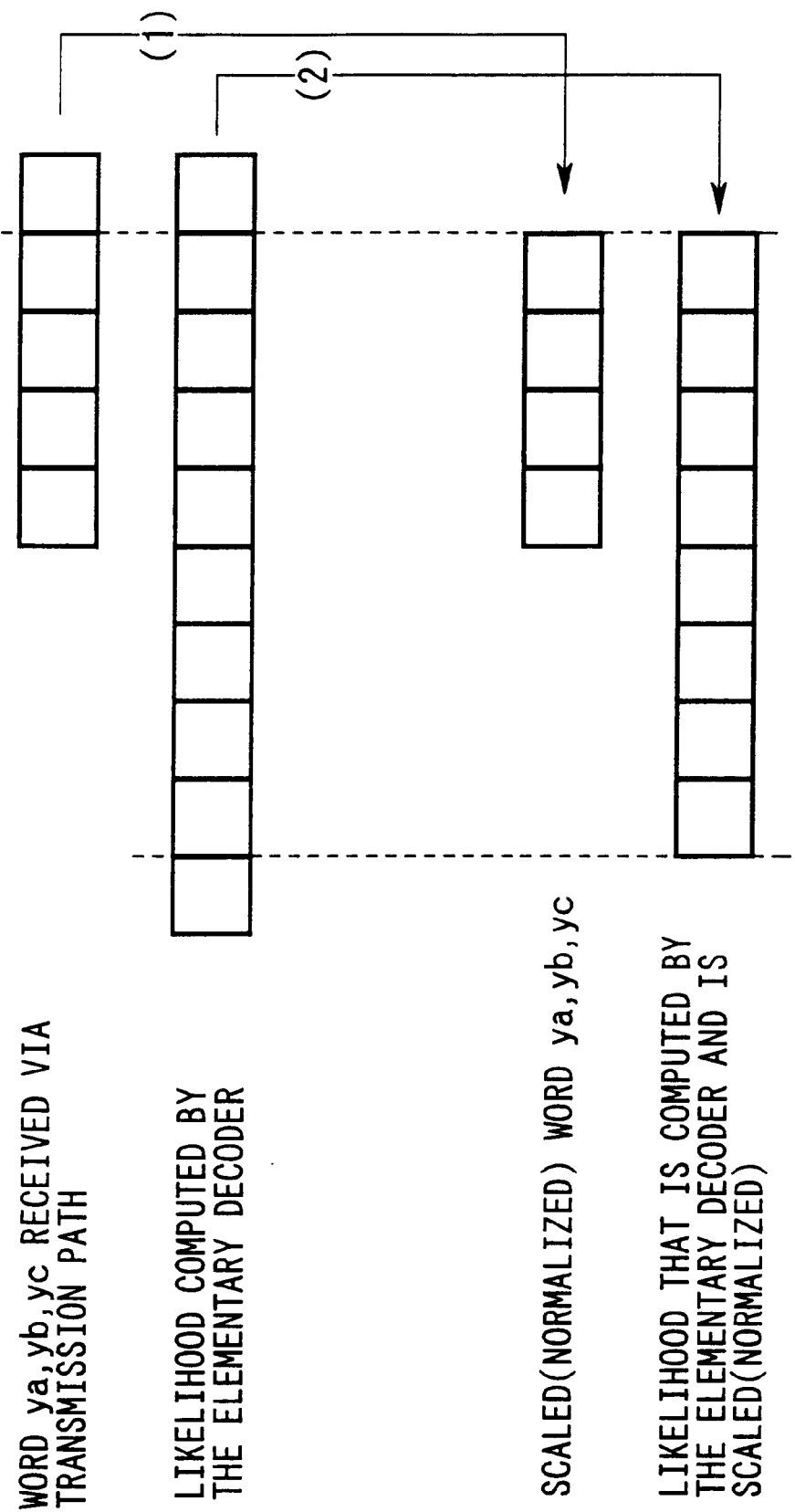
FIG. 4 is a chart showing the operation of the first embodiment of the invention.

FIG. 4 is a chart showing the operation of the first embodiment of the invention. The operation of this embodiment will be described below with reference to FIGS. 3 and 4.

At a start, the valid bit detecting part 53 outputs, for likelihoods computed by the elementary decoders 97-1 and 97-2, initial values of order identification information indicating a standard range where the elementary decoders 97-1 and 97-2 can cooperate with the interleavers 98-1 and 98-2 and the de-interleavers 99-1 and 99-2 without causing overflow or a truncation error and the number of bits that conforms to the standard range.

In a state that the individual sections operate steadily in cooperation, the valid bit detecting part 53 determines order identification information indicating the number of bits effectively representing likelihoods that have been computed by the elementary decoders 97-1 and 97-2 in the same manner as in the conventional example (e.g., bits excluding both or one of useless bits having a value "0" among high-order bits and useless bits having a value "0" among low-order bits) among all the bits representing those likelihoods as well as a weight (order) of those bits.

Every time the order identification information is updated, the normalization controlling part 54 judges the magnitude relationship between the following items:

The number of bits indicated by the new order identification information

The prescribed word lengths of words ya, yb, and yc and likelihoods to be input to the elementary decoders 97-1 and 97-2, the interleavers 98-1 and 98-2, and the de-interleavers 99-1 and 99-2

Further, the normalization controlling part 54 generates first and second selection signals indicating bit-based scaling that assures continuation of the above-mentioned cooperation by correcting the new number of bits and the order identification information in accordance with a result of the above judgment.

The normalizing part 51 performs the above-mentioned scaling (indicated by symbol (1) in FIG. 4) by extracting the bits of the order and the number of bits indicated by the first selection signal from bit strings representing words ya, yb, and yc that are read out cyclically from the receive buffer 96 in the same manner as in the conventional example, and supplies words ya, yb, and yc that are obtained as a result of the scaling to the elementary decoders 97-1 and 97-2 and the interleaver 98-1.

The normalizing part 52 similarly performs the above-mentioned scaling (indicated by symbol (2) in FIG. 4) by extracting the bits of the order and the number of bits indicated by the second selection signal from bit strings representing likelihoods computed by the respective elementary decoders 97-1 and 97-2, and supplies likelihoods that are obtained as a result of the scaling to the interleaver 98-2 and the de-interleaver 99-1, respectively.

With the above operation, even when the range of likelihoods that are obtained during the course of the decoding processing that is performed repeatedly for ya, yb, and yc in the same manner as in the conventional example varies, words ya, yb, and yc and likelihoods that are operation objects of the repeatedly performed decoding processing are supplied to the elementary decoders 97-1 and 97-2, the interleavers 98-1 and 98-2, and the de-interleavers 99-1 and 99-2 while scaling is performed that avoids overflow and minimizes rounding errors.

In general, the scale of hardware constituting the normalizing parts 51 and 52, the valid bit detecting part 53, and the normalization controlling part 54 is much smaller than the scale of hardware constituting computing units and memories that increases as the number of times of repetition of decoding processing increases.

Therefore, even in a case where the number of times of repetition of decoding processing is large or may vary to a large extent, furthermore, even when the word length of computing units provided in the elementary decoders 97-1 and 97-2 and the word length of memories provided in the respective interleavers 98-1 and 98-2 and de-interleavers 99-1 and 99-2 are small, this embodiment suppresses lowering in reliability and increase in running cost to very small degrees and enables accurate turbo-decoding.

Figure 5:
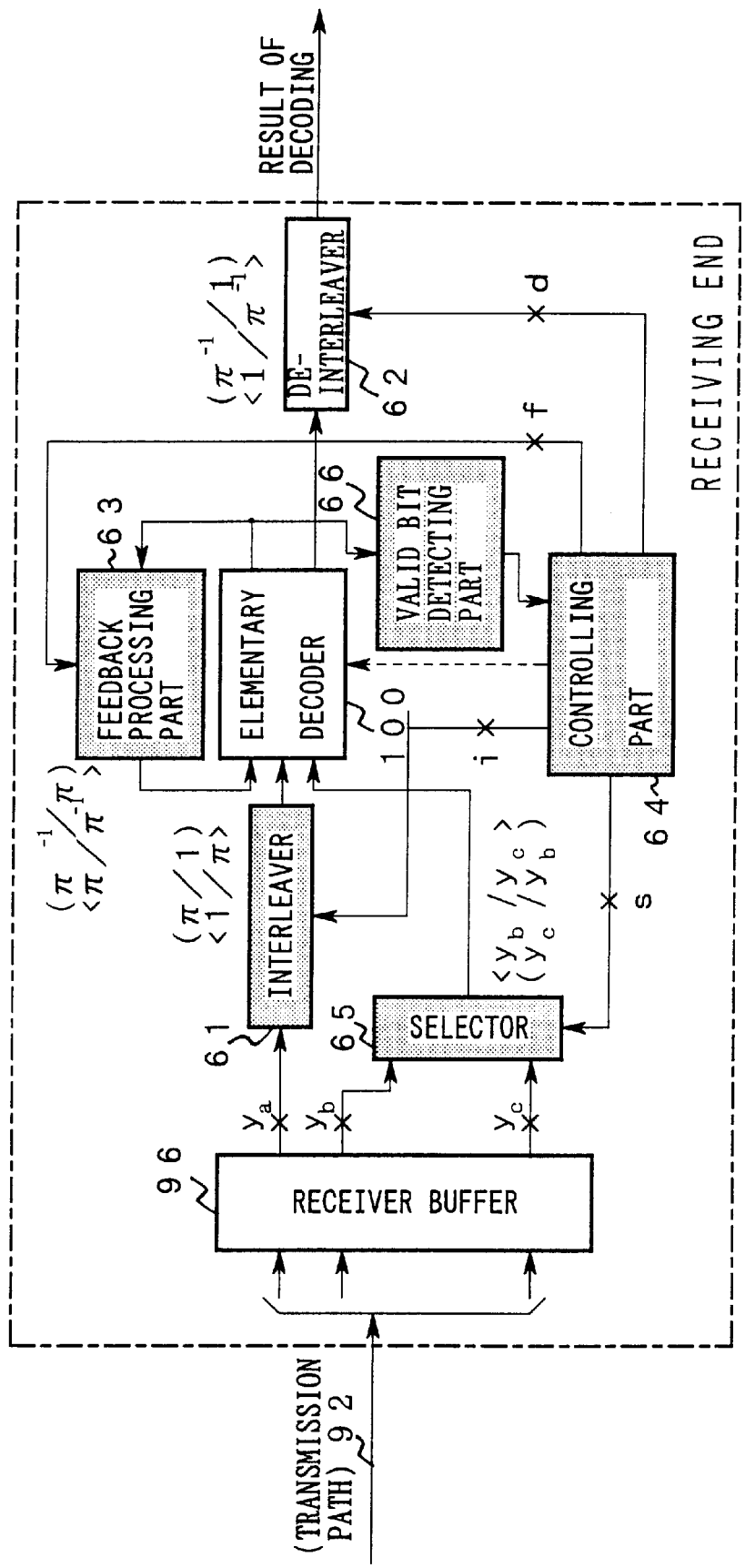
FIG. 5 is a block diagram showing a second embodiment of the invention.

FIG. 5 is a block diagram showing a second embodiment of the invention.

The components in FIG. 5 having the same function and configuration as the corresponding components in FIG. 11 are given the same reference symbols and will not be described below.

This embodiment is different in configuration from the conventional example of FIG. 11 in that an interleaver 61, a de-interleaver 62, a feedback processing part 63, a controlling part 64, and a selector 65 are provided in place of the interleaver 101, the de-interleaver 102, the feedback processing part 103, the controlling part 105, and the selector 104, respectively; and that a valid bit detecting part 66 is provided whose input is directly connected, together with the input of the feedback processing part 63, to a corresponding output of the elementary decoder 100 and whose output is connected to a corresponding input port of the controlling part 64.

The operation of this embodiment will be described below.

Like the valid bit detecting part 53 shown in FIG. 3, the valid bit detecting part 66 determines the number of bits and order identification information in accordance with a likelihood computed by the elementary decoder 100.

Every time the number of bits and order identification information are newly determined, the controlling part 64 judges the magnitude relationship between the new number of bits and the prescribed word lengths of words ya, yb, and yc and a likelihood to be input to the elementary decoder 100, the interleaver 61, and the de-interleaver 62 in the same manner as the normalization controlling part 54 shown in FIG. 3 does. The controlling part 64 determines bit-based scaling that assures continuation of the above-mentioned cooperation by correcting the new number of bits and the order identification information in accordance with a result of the above judgment.

Further, as in the case of the conventional example of FIG. 11, the controlling part 64 synchronizes with words ya, yb, and yc that are read out from the receive buffer 96 on a bit-by-bit basis and generates pieces of information I, D, F, and S (described above) on a bit-by-bit basis.

Still further, the controlling part 64 generates pieces of information i, d, f, and s by appending scaling pointers indicating the above-mentioned scaling to the respective pieces of information I, D, F, and S, and supplies those pieces of information i, d, f, and s to the interleaver 61, the de-interleaver 62, the feedback processing part 63, and the selector 65, respectively.

Having the functions of the selector 104 shown in FIG. 11 and the normalizing part 51 shown in FIG. 3, the selector 65 performs scaling by extracting the bits of the order and the number of bits indicated by the scaling pointer included in the information s from bit strings representing words yb and yc that are read out from the receive buffer 96 cyclically in accordance with the scaling pointer included in the information s in the same manner as the normalizing part 51 does. The selector 65 supplies words yb or yc obtained as a result of the scaling to the elementary decoder 100.

Having the functions of the normalizing part 51 shown in FIG. 3 and the interleaver 101 shown in FIG. 11, the interleaver 61 performs scaling by extracting the bits of the order and the number of bits indicated by the scaling pointer included in the information i from a bit string representing a word ya that is read out from the receive buffer 96 cyclically in accordance with the scaling information included in the information i in the same manner as the normalizing part 51 does. The interleaver 61 supplies a word ya obtained as a result of the-scaling to the elementary decoder 100.

Having the functions of the normalizing part 52 shown in FIG. 3 and the feedback processing part 103 shown in FIG. 11, the feedback processing part 63 performs scaling indicated by the scaling pointer included in the information f in the same manner as the normalizing part 52 does.

With the above operation, the elementary decoder 100 performs decoding processing that is equivalent to the decoding processing that is performed by the elementary decoders 97-1 and 97-2 shown in FIGS. 9 and 10 in the same manner as in the conventional example of FIG. 11.

Therefore, this embodiment makes the hardware scale smaller than in the embodiment of FIG. 3 while avoiding overflow and minimizing rounding errors like the embodiment of FIG. 3.

Figure 6:
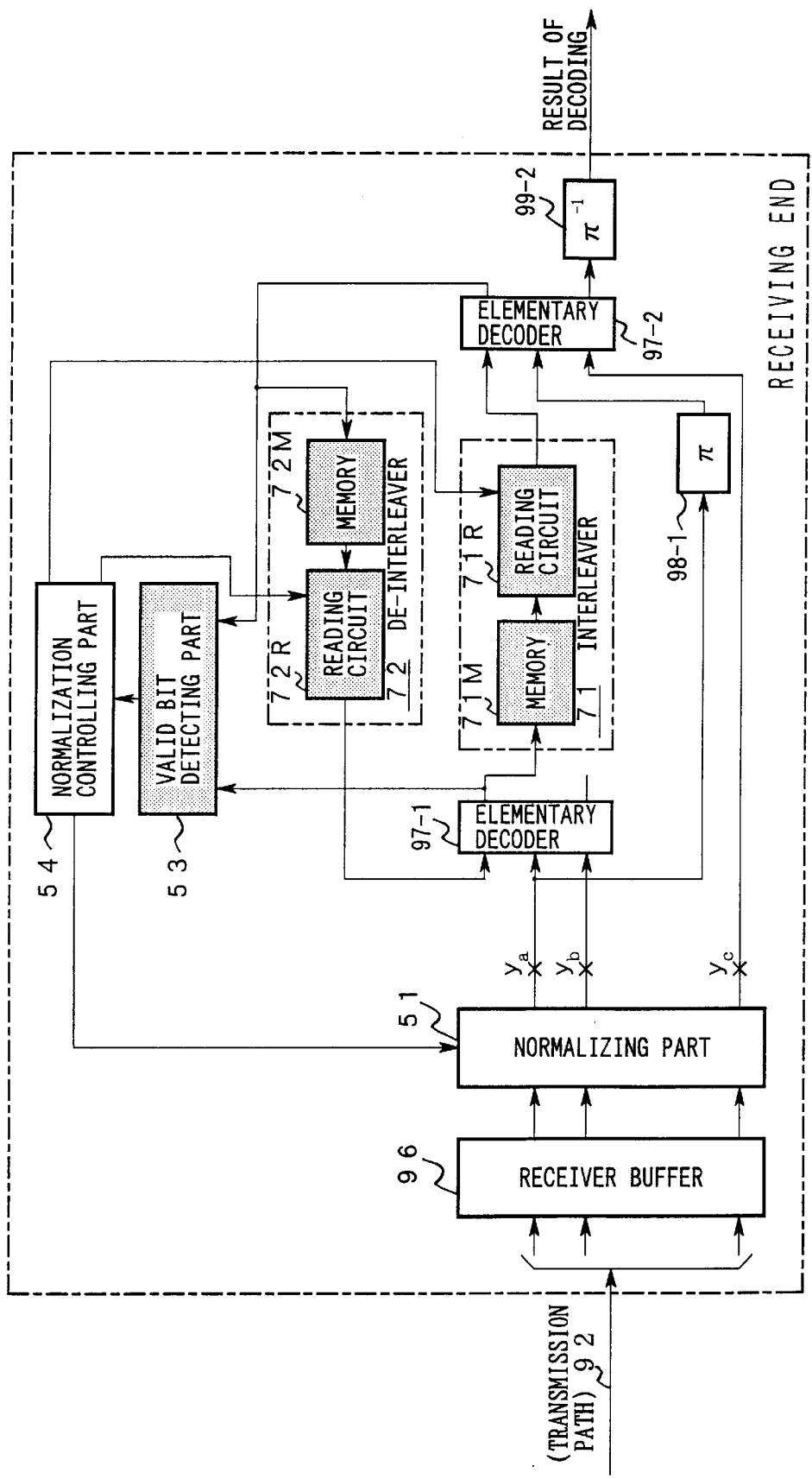
FIG. 6 is a block diagram showing a third embodiment of the invention.

FIG. 6 is a block diagram showing a third embodiment of the invention.

The components in FIG. 6 having the same function and configuration as the corresponding components in FIG. 3 are given the same reference symbols and will not be described below.

This embodiment is different in configuration from the embodiment of FIG. 3 in that an interleaver 71 is provided in place of the interleaver 98-2; that a de-interleaver 72 is provided in place of the de-interleaver 99-1; that the normalizing part 52 is not provided; and of the outputs of the normalization controlling part 54 the output connected to the normalization section 52 in FIG. 3 is connected to corresponding inputs of the interleaver 71 and the de-interleaver 72.

The interleaver 71 has a memory 71M to be used for interleave processing and a reading circuit 71R that has a bus to be used for reading from the memory 71M and a control terminal connected to a corresponding output of the normalization controlling part 54 and that performs addressing for reading from the memory 71M.

The de-interleaver 72 has a memory 72M to be used for de-interleave processing and a reading circuit 72R that has a bus to be used for reading from the memory 72M and a control terminal connected to a corresponding output of the normalization controlling part 54 and that performs addressing for reading from the memory 72M.

The operation of this embodiment will be described below.

The word lengths of the storage areas of the memory 71M provided in the interleaver 71 and the memory 72M provided in the de-interleaver 72 are preset at values that assure reliable storage of valid bit strings representing likelihoods that can be computed by the elementary decoders 97-1 and 97-2 in the same manner as in the embodiment of FIG. 3.

Likelihoods computed by the elementary decoders 97-1 and 97-2 are written cyclically to the storage areas of the memories 71M and 72M according to prescribed addressing (hereinafter referred to as "write addressing").

The reading circuits 71R and 72R read out the likelihoods that have been written to the storage areas of the memories 71M and 72M according to read addressing that is different from the above write addressing, perform scaling instead of the normalizing part 52 shown in FIG. 3 by extracting the bits of the order and the number of bits indicated by a second signal that is supplied from the normalizing part 54 from bits strings representing the read-out likelihoods, and supply likelihoods that are obtained as a result of the scaling to the respective elementary decoders 97-2 and 97-1, respectively.

As described above, since the interleaver 71 and the de-interleaver 72 that also serve as the normalizing part 52 shown in FIG. 3 are provided in place of the interleaver 98-2 and the de-interleaver 99-1 shown in FIG. 3, this embodiment can simplify the hardware configuration without lowering the accuracy of decoding as long as the number of valid bits representing likelihoods that can be computed by the elementary decoders 97-1 and 97-2 is allowable.

Figure 7:
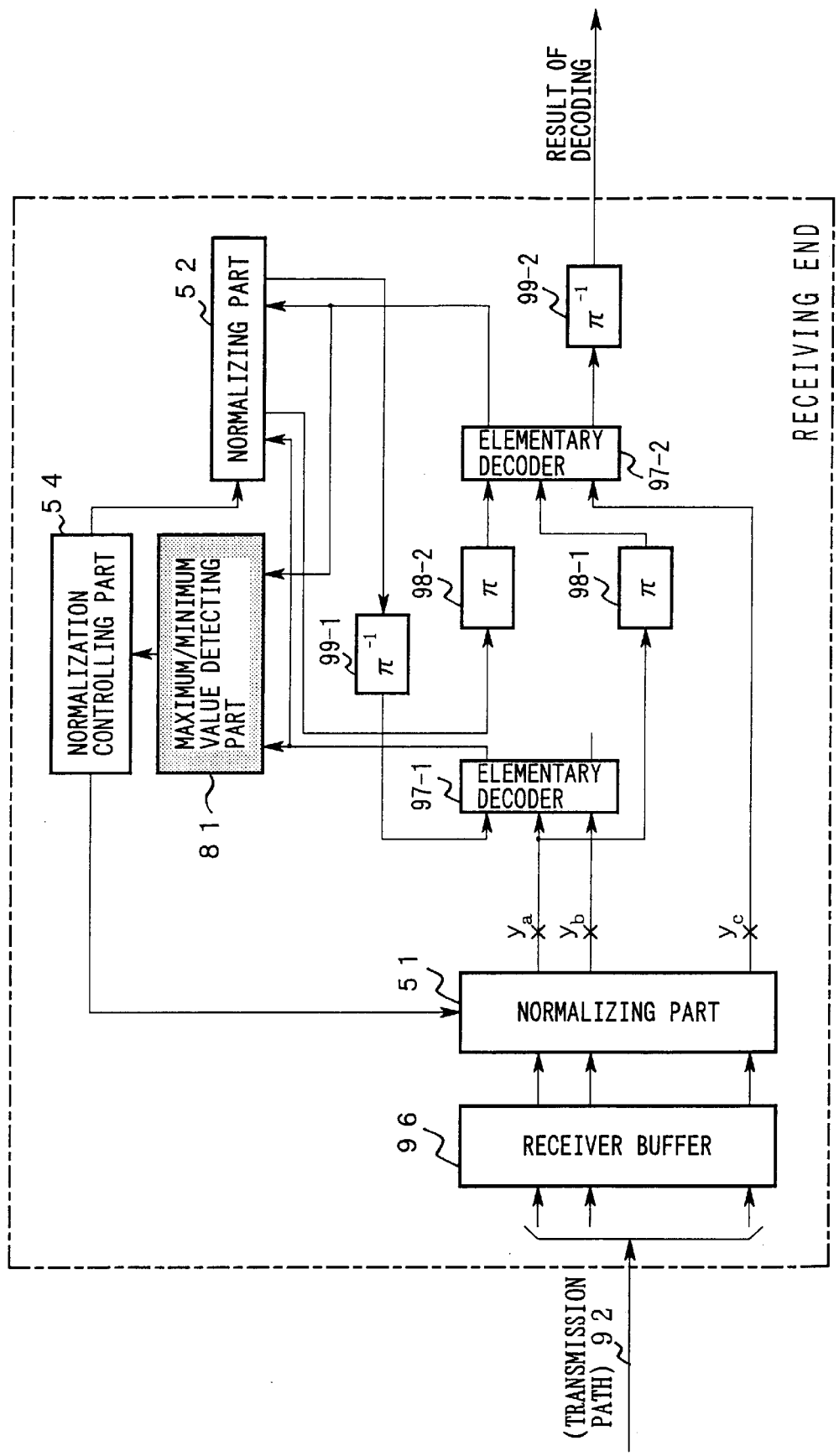
FIG. 7 is a block diagram showing a fourth embodiment of the invention.
Figure 12:
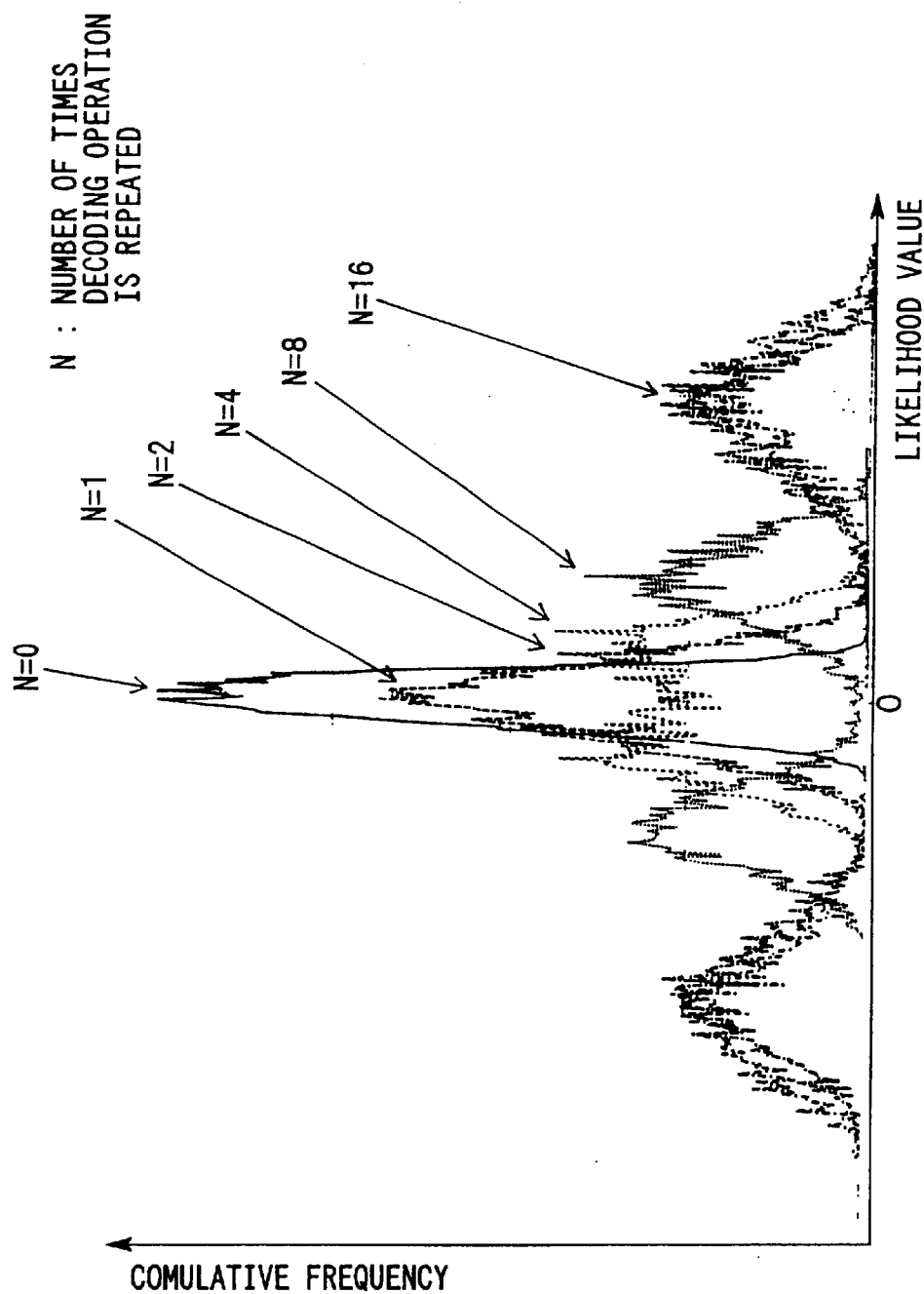
FIG. 12 is a graph showing a likelihood value distribution that varies with the number of times of repetition of decoding operation.

FIG. 7 is a block diagram showing a fourth embodiment of the invention.

The components in FIG. 7 having the same function and configuration as the corresponding components in FIG. 3 are given the same reference symbols and will not be described below.

This embodiment is different in configuration from the embodiment of FIG. 3 in that a maximum/minimum value detecting part 81 is provided in place of the valid bit detecting part 53.

FIG. 8 shows the operation of the fourth embodiment of the invention. The operation of this embodiment will be described below with reference to FIGS. 7 and 8.

The maximum/minimum value detecting part 81 accepts likelihoods (hereinafter referred to as "updated likelihoods") computed by the elementary decoders 97-1 and 97-2, and judges, for the values of updated likelihoods that are given according to scaling that is applied in advance (hereinafter referred to as "pre-scaling"), the magnitude relationship between:

the updated likelihoods computed by the elementary decoder 97-1, 97-2, and an upper limit that is preset less than or equal to the maximum likelihood value that can be expressed validly under this scaling the updated likelihoods computed by the elementary decoder 97-1, 97-2, and a lower limit that is preset greater than or equal to the minimum likelihood value that can be expressed validly under this scaling.

Further, the maximum/minimum value detecting part 81 generates the following identification information by performing the above judgment:

When it is recognized that the updated likelihood is smaller than the above-mentioned lower limit, order identification information is generated indicating that the scale should be changed to the 1-bit lower position than in the pre-scaling (indicated by symbols (1) in FIG. 8) while the predetermined, fixed number of bits is maintained.

When it is recognized that the updated likelihood is greater than or equal to the above-mentioned lower limit and less than or equal to the upper limit, order identification information is generated indicating that the application of the pre-scaling should be continued.

When it is recognized that the updated likelihood is greater than the above-mentioned upper limit, order identification information is generated indicating that the scale should be changed to the 1-bit higher position than in the pre-scaling (indicated by symbols (2) in FIG. 8) while the above-mentioned fixed number of bits is maintained.

The normalization controlling part 54 and the normalizing parts 51 and 52 perform the scaling indicated by such order identification information while cooperating with each other in accordance with such order identification information.

With the above operation, the normalizing parts 51 and 52 can change the scaling step by step without causing unduly large rounding errors even when the value or distribution of likelihoods that are obtained as a result of decoding that is repeatedly performed by the elementary decoders 97-1 and 97-2 varies rapidly as long as the above-mentioned difference between the maximum value and upper limit and the above-mentioned difference between the lower limit and minimum value are set at proper values in advance.

In this embodiment, the order of a likelihood that is obtained as a result of a subsequent decoding operation is prevented from increasing rapidly by 2 or more bits by setting the above-mentioned difference between the maximum value and upper limit and the above-mentioned difference between the lower limit and minimum value at proper values.

However, in a case where rounding of the least significant bit of a likelihood that is obtained as a result of the preceding decoding operation is permitted, the following processing may be performed by the maximum/minimum value detecting part-81 and scaling that is adapted to such order identification information (including appended information) may be performed by the normalization controlling part 54 and the normalizing parts 51 and 52:

Recognition of rapid order increase of two or more bits (mentioned above).

Processing of appending, to order identification information, information indicating that the likelihood should be rounded prior to the subsequent decoding operation.

Further, the above configuration secures flexible adaptability to the forms of the interleave processing performed by the interleavers 98-1 and 98-2 and the de-interleave processing performed by the de-interleavers 99-1 and 99-2 in addition to the scheme of decoding operations performed by the elementary decoders 97-1 and 97-2, and increases the stability to errors and deviations of the above-mentioned upper limit and lower limit.

In this embodiment, even when the order of a likelihood obtained as a result of decoding processing is different from the order of a likelihood obtained before in the same manner by two or more bits, neither a retrial of decoding processing for obtaining such a likelihood nor scaling of an object of an operation that precedes the retrial is performed.

However, occurrence of rounding errors (described above) may be avoided by making such a retrial as long as lowering of the speed of the decoding processing is permitted.

Each of the above embodiments does not specify a detailed procedure of the processing performed by the valid bit detecting part 53 or 66 or the maximum/minimum value detecting part 81. The procedure may be in any form as long as it can adapt to a distribution (described above) of likelihood values and can prevent overflow and generation of useless rounding errors during the course of operations to be performed subsequently.

Each of the above embodiments does not disclose the format of a bit string representing a likelihood that is determined by the elementary decoder 97-1, 97-2 or 100. The format may be in any form as long as a bit string as an object of subsequent operations (described above) is subjected to interleave processing and de-interleave processing with desired accuracy and scaling is performed thereon properly.

In each of the above embodiments, the procedure of the decoding operation to be performed by the elementary decoder 97-1, 97-2, or 100, the form of the interleave processing performed by the interleaver 98-1, 98-2, 61, or 71 or the feedback processing part 63, and the form of the de-interleave processing to be performed by the de-interleaver 99-1, 99-2, or 62 or the feedback processing part 63 are fixed. However, the procedure of such a decoding operation, the decoding scheme, the form of the interleave processing, and the form of the de-interleave processing may be switched properly as long as related information is given as known information in synchronism with a received sequence.

Each of the above embodiments does not specify the algorithm of the decoding processing performed by the elementary decoder 97-1, 97-2, or 100. The decoding processing, which is not a feature that characterizes the invention, can be realized according to not only the Viterbi decoding but also the following decoding schemes as long as they can adapt to the coding processing performed by the elementary coders 94-1 and 94-2 that are provided in the transmitting end 90 and can realize desired accuracy and response speed:

The MAP (maximum aposteriori probability) decoding (including the log-MAP decoding and the sub-log-MAP decoding) that is realized by operations that maximize the probability of correct decoding.

The SOVA (soft-output Viterbi algorithm) decoding.

Therefore, in the following, details of the decoding processing performed by the elementary decoders 97-1 and 97-2 will not be described.

Each of the above embodiments does not specify the standard according which to recognize completion of decoding processing. The standard may be any of the following and other standards, and is not a feature that characterizes the invention. Further, use of a variety of known algorithms is possible for the standard. Therefore, the standard will not be described below.

A time point when the difference between a previously determined likelihood and a newly determined likelihood becomes smaller than a desired value.

A time point when likelihoods have been determined repeatedly a predetermined number of times irrespective of the above difference.

In each of the above embodiments, scaling of likelihood and a word ya to become objects of a subsequent operation is performed on a bit-by-bit basis upon a start of the operation. However, the scaling may be performed every word length (bits) that is predetermined for the word length of a symbol at each symbol point as long as the scaling adapts to a signal space diagram under a modulation scheme that was applied to a received sequence that is transmitted over the transmission path 92 when turbo-decoding is realized at a desired speed with desired accuracy.

The scaling of a likelihood and a word ya may be performed at any time point of a subsequent operation that is performed to complete the turbo-decoding on a code block (a word ya, yb, or yc) basis. The scaling may be performed plural times.

In each of the embodiments of FIGS. 3, 6, and 7, the number of elementary decoders 97-1 and 97-2 provided in the receiving end is equal to the number N (=2) of elementary coders that are used for the turbo-coding in the transmitting end. However, the number n of elementary decoders to be provided in the receiving end may be smaller than the number N of elementary coders, and the transmission delay time may be decreased or the transmission quality may be increased by causing the n elementary decoders to cooperate to perform the turbo-decoding efficiently according to a pipeline control.

The invention is not limited to the above embodiments and various modifications may be made without departing from the spirit and the scope of the invention any improvement may be made in part or all of the components.

What is claimed is:

1. A turbo decoder comprising:

a decoding means for turbo-decoding on a received sequence on a code block basis, by restoring transmission information represented by the received sequence;

a range watching means for obtaining a distribution of likelihood values that are obtained during the course of the turbo-decoding performed by said decoding means; and a scaling means for determining a scaling that will suppress the variation in a distribution of likelihood values obtained as a result of a subsequent operation, to be a scaling for an object of said subsequent operation performed under the distribution obtained by the range watching means, where said subsequent operation is performed for said decoding means to complete the turbo-decoding for a common code block, wherein said decoding means applies the scaling determined by said scaling means to the object of said subsequent operation.

2. The turbo decoder according to claim 1, wherein said decoding means performs, in block, interleave processing to be performed prior to both a pre-operation that is performed prior to said subsequent operation on a non-coded word, among the objects of said subsequent operation, representing transmission information that was appended to a common code block on a transmitting end without being subjected to any coding, and said subsequent operation, and applies said scaling determined by said scaling means to said non-coded word.

3. The turbo decoder according to claim 2, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

4. The turbo decoder according to claim 2, wherein said range-watching means obtains the likelihood value distribution as a maximum value or an average value of likelihood values obtained previously.

5. The turbo decoder according to claim 2, wherein said decoding means has a single elementary decoder that can adapt to all of a plurality of decoding schemes that are employed during the course of turbo-coding on a transmitting end to generate a transmission sequence corresponding to the received sequence and performs decoding according to a single designated decoding scheme among said plurality of decoding schemes, and turbo-decodes said received sequence by decoding in series according to the plurality of decoding methods by using said single elementary decoder.

6. The turbo decoder according to claim 5, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

7. The turbo decoder according to claim 5, wherein said range-watching means obtains the likelihood value distribution as a maximum value or an average value of likelihood values obtained previously.

8. The turbo decoder according to claim 5, wherein said decoding means has memory to be used in an interleave processing and a de-interleave processing that are performed on the object of said subsequent operation prior to said subsequent operation, and performs said scaling determined by said scaling means while reading from said memory.

9. The turbo decoder according to claim 8, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

10. The turbo decoder according to claim 8, wherein said range-watching means obtains the likelihood value distribution as a maximum value or an average value of likelihood values obtained previously.

11. The turbo decoder according to claims 2, wherein said decoding means has memory to be used in an interleave processing and a de-interleave processing that are performed on the object of said subsequent operation prior to said subsequent operation, and performs said scaling determined by said scaling means while reading from said memory.

12. The turbo decoder according to claim 11, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

13. The turbo decoder according to claim 11, wherein said range-watching means obtains the likelihood value distribution as a maximum value or an average value of likelihood values obtained previously.

14. The turbo decoder according to claim 2, wherein said decoding means has a number n of elementary decoders and turbo-decodes the received sequence according to a pipeline control while cooperating with said n of elementary decoders, n being smaller than the number N of times coding was performed during the course of turbo-coding on a transmitting end to generate a transmission sequence corresponding to the received sequence.

15. The turbo decoder according to claim 14, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

16. The turbo decoder according to claim 14, wherein said range-watching means obtains the likelihood value distribution as a maximum value or an average value of likelihood values obtained previously.

17. The turbo decoder according to claim 14, wherein said decoding means has memory to be used in an interleave processing and a de-interleave processing that are performed on the object of said subsequent operation prior to said subsequent operation, and performs said scaling determined by said scaling means while reading from said memory.

18. The turbo decoder according to claim 17, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

19. The turbo decoder according to claim 17, wherein said range-watching means obtains the likelihood value distribution as a maximum value or an average value of likelihood values obtained previously.

20. The turbo decoder according to claim 1, wherein said decoding means performs, in block, de-interleave processing that is reversible to all interleave processing that was performed during said pre-operation and all interleave processing to be performed prior to said pre-operation and said subsequent operation on a non-coded word, among the objects of said subsequent operation, subjected to said pre-operation and represents transmission information appended to said common code block without being subjected to any coding on a transmitting end, and applies said scaling determined by the scaling means to said non-coded word.

21. The turbo decoder according to claim 20, wherein said range-watching means obtains the likelihood value distribution as a maximum value or an average value of likelihood values obtained previously.

22. The turbo decoder according to claim 20, wherein said decoding means has a number n of elementary decoders and turbo-decodes the received sequence according to a pipeline control while cooperating with said n of elementary decoders, n being smaller than the number N of times coding was performed during the course of turbo-coding on a transmitting end to generate a transmission sequence corresponding to the received sequence.

23. The turbo decoder according to claim 22, wherein said range-watching means obtains the likelihood value distribution as a maximum value or an average value of likelihood values obtained previously.

24. The turbo decoder according to claim 22, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

25. The turbo decoder according to claim 22, wherein said decoding means has memory to be used in an interleave processing and a de-interleave processing that are performed on the object of said subsequent operation prior to said subsequent operation, and performs said scaling determined by said scaling means while reading from said memory.

26. The turbo decoder according to claim 25, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

27. The turbo decoder according to claim 25, wherein said range-watching means obtains the likelihood value distribution as a maximum value or an average value of likelihood values obtained previously.

28. The turbo decoder according to claim 20, wherein said decoding means has a single elementary decoder that can adapt to all of a plurality of decoding schemes that are employed during the course of turbo-coding on a transmitting end to generate a transmission sequence corresponding to the received sequence and performs decoding according to a single designated decoding scheme among said plurality of decoding schemes, and turbo-decodes said received sequence by decoding in series according to the plurality of decoding methods by using said single elementary decoder.

29. The turbo decoder according to claim 28, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

30. The turbo decoder according to claim 28, wherein said range-watching means obtains the likelihood value distribution as a maximum value or an average value of likelihood values obtained previously.

31. The turbo decoder according to claim 28, wherein said decoding means has memory to be used in an interleave processing and a de-interleave processing that are performed on the object of said subsequent operation prior to said subsequent operation, and performs said scaling determined by said scaling means while reading from said memory.

32. The turbo decoder according to claim 31, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

33. The turbo decoder according to claim 31, wherein said range-watching means obtains the likelihood value distribution as a maximum value or an average value of likelihood values obtained previously.

34. The turbo decoder according to claim 20, wherein said decoding means has memory to be used in an interleave processing and a de-interleave processing that are performed on the object of said subsequent operation prior to said subsequent operation, and performs said scaling determined by said scaling means while reading from said memory.

35. The turbo decoder according to claim 34, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

36. The turbo decoder according to claim 34, wherein said range-watching means obtains the likelihood value distribution as a maximum value or an average value of likelihood values obtained previously.

37. The turbo decoder according to claim 20, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

38. The turbo decoder according to claim 1, wherein said decoding means has a number n of elementary decoders and turbo-decodes the received sequence according to a pipeline control while cooperating with said n of elementary decoders, n being smaller than the number N of times coding was performed during the course of turbo-coding on a transmitting end to generate a transmission sequence corresponding to the received sequence.

39. The turbo decoder according to claim 38, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

40. The turbo decoder according to claim 38, wherein said range-watching means obtains the likelihood value distribution as a maximum value or an average value of likelihood values obtained previously.

41. The turbo decoder according to claim 38, wherein said decoding means has memory to be used in an interleave processing and a de-interleave processing that are performed on the object of said subsequent operation prior to said subsequent operation, and performs said scaling determined by said scaling means while reading from said memory.

42. The turbo decoder according to claim 41, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

43. The turbo decoder according to claim 41, wherein said range-watching means obtains the likelihood value distribution as a maximum value or an average value of likelihood values obtained previously.

44. The turbo decoder according to claim 1, wherein said decoding means has a single elementary decoder that can adapt to all of a plurality of decoding schemes that are employed during the course of turbo-coding on a transmitting end to generate a transmission sequence corresponding to the received sequence and performs decoding according to a single designated decoding scheme among said plurality of decoding schemes, and turbo-decodes said received sequence by decoding in series according to the plurality of decoding methods by using said single elementary decoder.

45. The turbo decoder according to claim 44, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

46. The turbo decoder according to claim 44, wherein said range-watching means obtains the likelihood value distribution as a maximum value or an average value of likelihood values obtained previously.

47. The turbo decoder according to claim 44, wherein said decoding means has memory to be used in an interleave processing and a de-interleave processing that are performed on the object of said subsequent operation prior to said subsequent operation, and performs said scaling determined by said scaling means while reading from said memory.

48. The turbo decoder according to claim 47, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

49. The turbo decoder according to claim 47, wherein said range-watching means obtains the likelihood value distribution as a maximum value or an average value of likelihood values obtained previously.

50. The turbo decoder according to claim 1, wherein said decoding means has memory to be used in an interleave processing and a de-interleave processing that are performed on the object of said subsequent operation prior to said subsequent operation, and performs said scaling determined by said scaling means while reading from said memory.

51. The turbo decoder according to claim 50, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

52. The turbo decoder according to claim 50, wherein said range-watching means obtains the likelihood value distribution as a maximum value or an average value of likelihood values obtained previously.

53. The turbo decoder according to claim 1, wherein said scaling means obtains, when the scaling should be updated, a range of varied likelihood values as compared with previously determined scaling, and determines, as a new scaling, a scaling that makes the width of the range smaller than a prescribed threshold value when the width of the range has exceeded the prescribed threshold value.

54. The turbo decoder according to claim 1, wherein said range-watching means obtains the likelihood value distribution as a maximum value or an average value of likelihood values obtained previously.

\* \* \* \* \*